(12) United States Patent
Chang

(10) Patent No.: US 11,927,980 B2
(45) Date of Patent: Mar. 12, 2024

(54) ELECTRONIC DEVICE AND POWERING METHOD THEREOF

(71) Applicant: Nuvoton Technology Corporation, Hsinchu Science Park (TW)

(72) Inventor: Hen-Kai Chang, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/718,985

(22) Filed: Dec. 18, 2019

(65) Prior Publication Data
US 2020/0192418 A1 Jun. 18, 2020

(30) Foreign Application Priority Data
Dec. 18, 2018 (TW) .................................. 107145548

(51) Int. Cl.
*G06F 1/06* (2006.01)
(52) U.S. Cl.
CPC ....................................... *G06F 1/06* (2013.01)
(58) Field of Classification Search
None
See application file for complete search history.

(56) References Cited

U.S. PATENT DOCUMENTS

| 6,980,191 | B2 | 12/2005 | Nakamura et al. |
| 7,777,556 | B2 * | 8/2010 | Naitou ...................... G06F 1/26 327/544 |
| 8,850,256 | B2 * | 9/2014 | Shibayama ........... G06F 1/3203 713/375 |
| 9,053,257 | B2 * | 6/2015 | Schreiber ................ G06F 30/30 |
| 9,123,308 | B2 | 9/2015 | Moriyama et al. |
| 9,214,924 | B2 * | 12/2015 | Priel ................. H03K 19/00346 |
| 9,230,046 | B2 * | 1/2016 | Asaad .................... G06F 30/331 |
| 9,298,250 | B2 * | 3/2016 | Drake ...................... G06F 1/324 |
| 10,254,782 | B2 * | 4/2019 | He .......................... G11C 7/222 |
| 10,698,439 | B1 * | 6/2020 | Sun ........................... G06F 1/06 |
| 10,705,558 | B2 * | 7/2020 | Huang ...................... G06F 1/06 |

(Continued)

FOREIGN PATENT DOCUMENTS

| CN | 100362540 C | 1/2008 |
| TW | 201109908 A | 3/2011 |

OTHER PUBLICATIONS

Office Action dated Mar. 4, 2020 in TW Application No. 107145548.

(Continued)

*Primary Examiner* — Thomas J. Hiltunen
*Assistant Examiner* — Khareem E Almo
(74) *Attorney, Agent, or Firm* — Muncy, Geissler, Olds & Lowe, P.C.

(57) ABSTRACT

An electronic device includes a controller, a clock generator, a first operation interface and a first functional unit. The controller generates a first clock enable signal, and then generates a first operation instruction. The clock generator generates a first clock according to the first clock enable signal. The first operation interface generates a first power supply signal according to the first clock, and translates the first operation instruction into a first operation signal. The first functional unit is enabled according to the first power supply signal, and starts to operate according to the first operation signal.

9 Claims, 5 Drawing Sheets

(56) References Cited

U.S. PATENT DOCUMENTS

| | | | |
|---|---|---|---|
| 2003/0122809 A1 | 7/2003 | Sakamaki et al. | |
| 2008/0303552 A1* | 12/2008 | Chueh | G06F 1/10 327/293 |
| 2013/0015904 A1 | 1/2013 | Priel et al. | |
| 2014/0125381 A1 | 5/2014 | Schreiber et al. | |
| 2016/0109898 A1* | 4/2016 | Sheafor | H03L 7/06 327/293 |
| 2020/0192418 A1* | 6/2020 | Chang | G06F 1/06 |

OTHER PUBLICATIONS

Chinese Office Action dated Mar. 1, 2021, as issued in corresponding China Patent Application No. 201911306872.X, 6 pages.
Chinese Office Action dated May 19, 2021, as issued in corresponding China Patent Application No. 201911306872.X, 4 pages.

\* cited by examiner

ELECTRONIC DEVICE AND POWERING METHOD THEREOF

CROSS-REFERENCE TO RELATED APPLICATION

This application claims the benefit of Taiwan Patent Application No. 107145548, filed on Dec. 18, 2018, in the Taiwan Intellectual Property Office, the disclosure of which is incorporated herein in its entirety by reference.

BACKGROUND OF THE INVENTION

1. Field of the Invention

The present invention relates to an electronic device and a powering method thereof, and more particularly to an electronic device which is able to supply power to functional units in a sequential order, and a powering method thereof.

2. Description of the Related Art

Generally, an electronic device often has multiple functional units. When the electronic device is powered on or its operation resumes from a sleep mode, if all functional units of the electronic device are powered on at the same time, this inevitably causes a huge inrush current on the power supply and the supply voltage can become unstable.

If the functional unit, which does not need to operate immediately, is also powered on at the same time as other function units, the functional unit waiting for an operational instruction also consumes unnecessary power. Since the complexity of the electronic device is becoming higher and higher, the powering method of the electronic device needs to be optimized in order to improve the stability of supply voltage, and to prevent power loss in the electronic device.

SUMMARY OF THE INVENTION

An objective of the present invention is to provide an electronic device and a powering method thereof, so as to solve the above problem.

In order to achieve the objective, the present invention provides an electronic device comprising a controller, a clock generator, a first operation interface, and a first functional unit. The controller is configured to generate a first operation instruction and a first clock enable signal. The clock generator is configured to generate a first clock according to the first clock enable signal. The first operation interface is configured to generate a first power supply signal according to the first clock, and to translate the first operation instruction into a first operation signal. The first functional unit is enabled according to the first power supply signal, and configured to operate according to the first operation signal.

According to an embodiment, the first functional unit comprises a first internal functional circuit and a second internal functional circuit. The first internal functional circuit is enabled according to the first power supply signal. When the first internal functional circuit operates according to the first operation signal, the first internal functional circuit generates an internal enable signal. The second internal functional circuit is enabled according to the internal enable signal.

According to an embodiment, the controller generates a second operation instruction and a second clock enable signal, the clock generator generates a second clock according to the second clock enable signal, and the electronic device further comprises a second operation interface and a second functional unit. The second operation interface is coupled to the bus and configured to generate a second power supply signal according to the second clock, and to translate a second operation instruction into a second operation signal. The second functional unit is enabled according to the second power supply signal, and configured to operate according to the second operation signal.

According to an embodiment, the controller, the clock generator, the first operation interface and the second operation interface are supplied with a supply voltage at the same time when the electronic device is enabled according to a power-on signal. After the first functional unit is enabled according to the first power supply signal, the first functional unit is supplied with the supply voltage, wherein after the second functional unit is enabled according to the second power supply signal, the second functional unit is supplied with the supply voltage.

According to an embodiment, the electronic device further comprises a bus coupled to the controller, the clock generator, the first operation interface and the second operation interface. The electronic device is configured to transmit the first operation instruction and the first clock to the first operation interface. The electronic device is configured to transmit the second operation instruction and the second clock to the second operation interface.

According to an embodiment, the first operation interface and the second operation interface each comprises an instruction translator, an edge detector, a timer and a logic gate. The instruction translator is configured to translate the first operation instruction or the second operation instruction into the first operation signal or the second operation signal, respectively. The edge detector is configured to detect a signal edge of the first clock or the second clock to generate the first power supply signal or the second power supply signal. After being completely enabled, the first functional unit or the second functional unit outputs the first ready signal or the second ready signal, respectively. The timer is configured to count a predetermined time, and configured to generate a counting signal. The logic gate is configured to perform a logic calculation on the counting signal and the first ready signal, to generate a first hardware signal, or perform a logic calculation on the counting signal and the second ready signal, to generate a second hardware signal. The controller outputs the first operation instruction according to the first hardware signal. The controller outputs the second operation instruction according to the second hardware signal.

In order to achieve the objective, the present invention provides a powering method which is applicable to an electronic device comprising a first functional unit. The powering method comprises the following steps: generating a first clock; enabling the first functional unit according to the first clock; and operating the first functional unit.

According to an embodiment, the first functional unit comprises a first internal functional circuit and a second internal functional circuit, and the step of enabling the first functional unit according to the first clock comprises further comprises the following steps: enabling the first internal functional circuit according to the first clock; and enabling the second internal functional circuit after the first internal functional circuit is operated.

According to an embodiment, the electronic device can comprise a second functional unit, and the powering method further comprises the following steps: generating a second clock; enabling a second functional unit according to the second clock; and operating the second functional unit.

According to an embodiment, the electronic device is supplied with a supply voltage, and the first functional unit is supplied with the supply voltage after the first functional unit is enabled according to the first power supply signal, and the second functional unit is supplied with the supply voltage after the second functional unit is enabled according to the second power supply signal.

According to an embodiment, the step of enabling the first functional unit according to the first clock, can comprise the following steps: detecting a signal edge of the first clock; supplying the first functional unit with the supply voltage when the signal edge of the first clock is detected; counting a predetermined time; and outputting the first operation instruction when the first functional unit is completely enabled and the predetermined time is completely counted.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
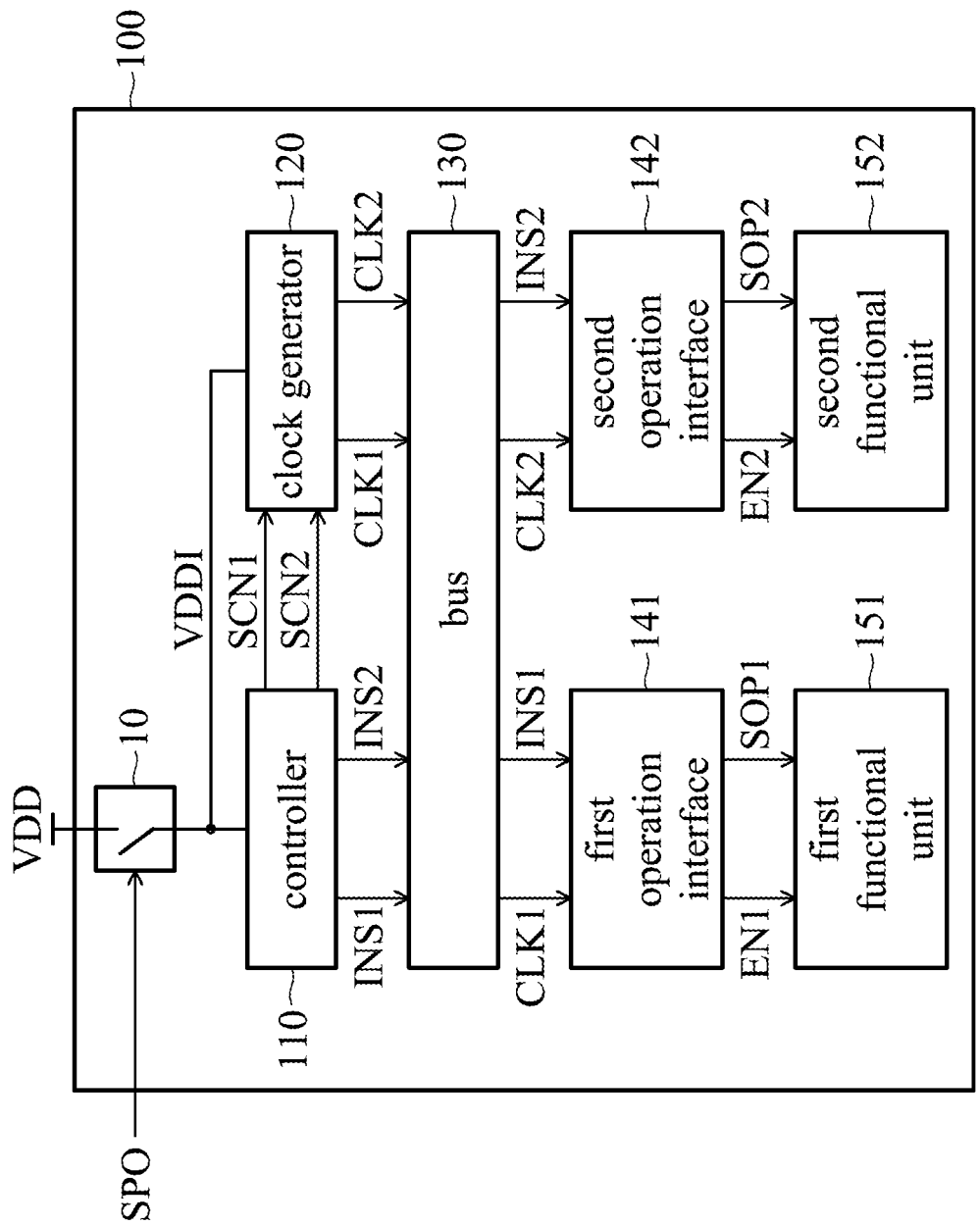
FIG. 1 is a block diagram of an electronic device of an embodiment of the present invention.

The following embodiments of the present invention are described in detail herein with reference to the accompanying drawings. These drawings show specific examples of the embodiments of the present invention. These embodiments are provided so that this disclosure will be thorough and complete, and will fully convey the scope of the present invention to those skilled in the art. It should be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It should be acknowledged that although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Please refer to FIG. 1, which shows a block diagram of an electronic device of an embodiment of the present invention. As shown in FIG. 1, the electronic device 100 includes a controller 110, a clock generator 120, a bus 130, a first operation interface 141, a second operation interface 142, a first functional unit 151 and a second functional unit 152. According to an embodiment, when receiving a power-on signal SPO, the electronic device 100 starts to be supplied with the supply voltage VDD through a power switch 10, and an internal supply voltage VDDI is generated.

The controller 110 generates a first operation instruction INS1, a second operation instruction INS2, a first clock enable signal SCN1 and a second clock enable signal SCN2. The clock generator 120 generates a first clock CLK1 according to the first clock enable signal SCN1 generated by the controller 110, and generates a second clock CLK2 according to the second clock enable signal SCN2 generated by the controller 110. According to an embodiment, the controller 110 can be a central processor.

The bus 130 is coupled to the controller 110 and the clock generator 120, and configured to transmit the second operation instruction INS2 and the first operation instruction INS1, which are generated by the controller 110, and the first clock CLK1 and the second clock CLK2, which are generated by the clock generator 120, to a corresponding functional unit.

According to an embodiment, after the electronic device 100 is powered on and the internal supply voltage VDDI is generated, the first operation interface 141 and the second operation interface 142 can be supplied with the internal supply voltage VDDI, and this power supply operation is not shown in FIG. 1. After the first operation interface 141 receives the first clock CLK1 via the bus 130, the first operation interface 141 generates a first power supply signal EN1 according to the first clock CLK1. The first operation interface 141 further receives the first operation instruction INS1 from the bus 130, and translates the first operation instruction INS1 into a first operation signal SOP1.

The first functional unit 151 is enabled according to the first power supply signal EN1, and then starts the corresponding operation according to the first operation signal SOP1 translated by the first operation interface 141. According to an embodiment, when the first functional unit 151 is enabled according to the first power supply signal EN1, it indicates that the first functional unit 151 can be supplied with the internal supply voltage VDDI and the first functional unit 151 can also be supplied with the supply voltage VDD.

When the second operation interface 142 receives the second clock CLK2 via the bus 130, the second operation interface 142 generates a second power supply signal EN2 according to the second clock CLK2. The second operation interface 142 further receives the second operation instruction INS2 from the bus 130, and translates the second operation instruction INS2 into a second operation signal SOP2.

The second functional unit 152 is enabled according to the second power supply signal EN2, and then starts operation according to the second operation signal SOP2 translated by the second operation interface 142. According to an embodiment, when the second functional unit 152 is enabled according to the second power supply signal EN2, it indicates that the second functional unit 152 can be supplied with the internal supply voltage VDDI and the second functional unit 152 also can be supplied with the supply voltage VDD.

According to some embodiments of the present invention, at least one of the first functional unit 151 and the second functional unit 152 can be a static random-access memory (SRAM). According to another embodiments of the present invention, at least one of the first functional unit 151 and the second functional unit 152 can be a transmission module, such as a universal asynchronous receiver/transmitter, an Ethernet module, and the like. According to another embodiment of the present invention, at least one of the first functional unit 151 and the second functional unit 152 can be a motor driver. According to other embodiments of the present invention, the first functional unit 151 and the second functional unit 152 can each be a known functional circuit, an unknown functional circuit, or a combination thereof.

According to an embodiment, when the controller 110 needs to use at least one of the first functional unit 151 and the second functional unit 152, the controller 110 can use the first clock enable signal SCN1 and/or the second clock enable signal SCN2 to control the clock generator 120 to generate the first clock CLK1 and/or the second clock CLK2, and after the first functional unit 151 and/or the second functional unit 152 is completely enabled, the controller 110 can output the first operation instruction INS1 and/or the second operation instruction INS2 to control the first functional unit 151 and/or the second functional unit 152 for performing the corresponding operation.

According to another embodiment of the present invention, the controller 110 can output the first operation instruction INS1, the second operation instruction INS2, the first clock enable signal SCN1 and the second clock enable signal SCN2 at the same time, and after the first functional unit 151 and/or the second functional unit 152 is completely enabled, the first functional unit 151 and/or the second functional unit 152 performs the corresponding operation according to the first operation instruction INS1 and/or the second operation instruction INS2, respectively.

According to another embodiment of the present invention, after outputting the first clock enable signal SCN1 and the second clock enable signal SCN2, the controller 110 can output the first operation instruction INS1 and the second operation instruction INS2. When the first functional unit 151 and/or the second functional unit 152 is completely enabled according to the first clock enable signal SCN1 and/or second clock enable signal SCN2, the first functional unit 151 and/or the second functional unit 152 can perform the corresponding operation according to the first operation instruction INS1 and/or the second operation instruction INS2, respectively.

According to an embodiment, when the controller 110 does not control the clock generator 120 to generate the first clock CLK1 and/or second clock CLK2, it indicates that the controller 110 does not need to use the first functional unit 151 and/or the second functional unit 152. When the controller 110 is not operating and at least one of the first functional unit 151 and second functional unit 152 is not enabled, it is beneficial to reduce power loss and solve the problem of surge current occurred on supply voltage VDD when all functional units are enabled at the same time.

According to other embodiments of the present invention, the electronic device 100 can include one or more functional unit, and FIG. 1 shows two functional units to illustrate the embodiment, but the present invention is not limited thereto.

Figure 2:
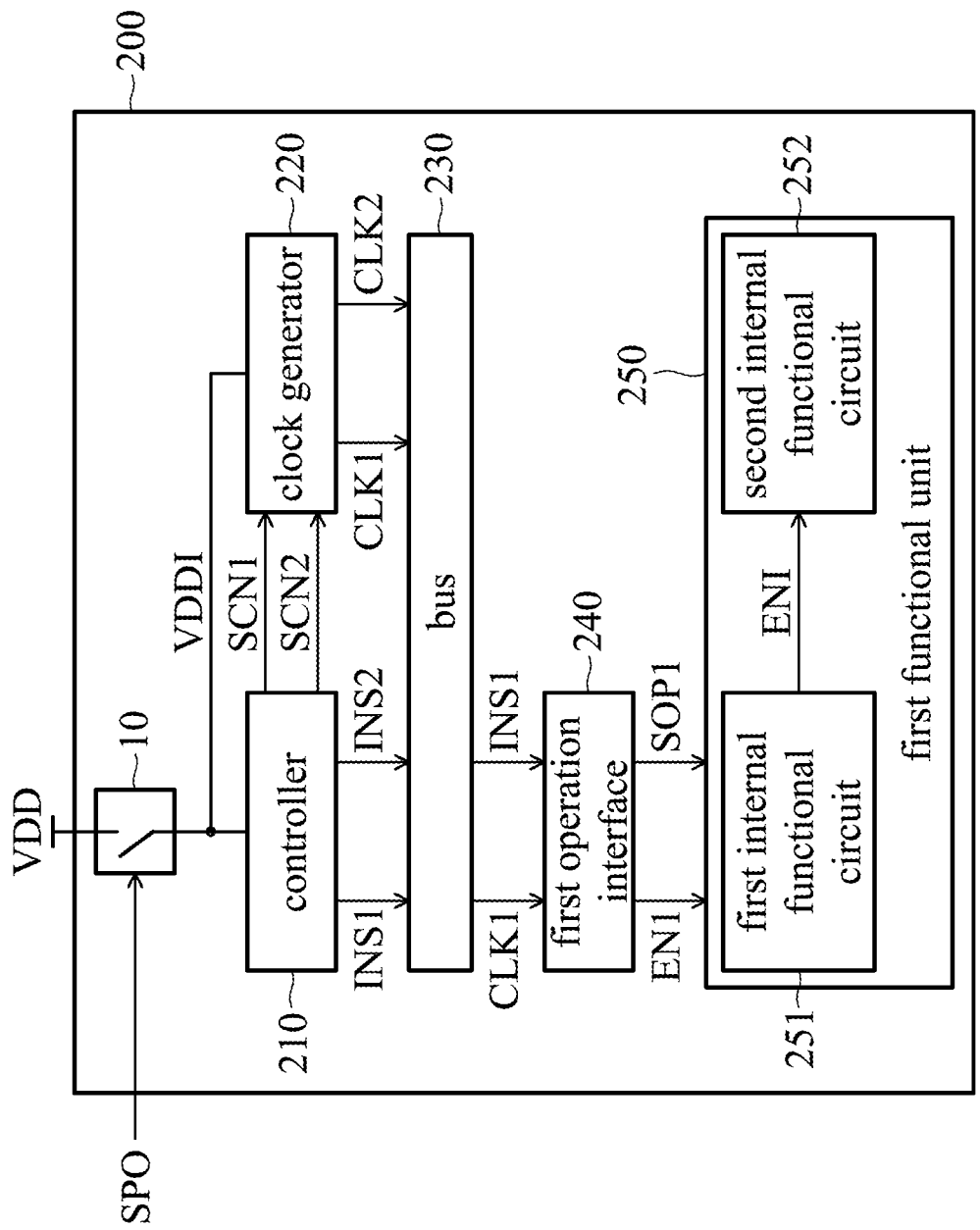
FIG. 2 is a block diagram of an electronic device of another embodiment of the present invention.

Please refer to FIG. 2, which is a block diagram of an electronic device according to another embodiment of the present invention. As shown in FIG. 2, the electronic device 200 can include a controller 210, a clock generator 220, a bus 230, a first operation interface 240 and a first functional unit 250. The controller 210, the clock generator 220, the bus 230 and the first operation interface 240 correspond to the controller 110, the clock generator 120, the bus 130 and the first operation interface 141 of FIG. 1, respectively, so detailed descriptions are not repeated herein.

As shown in FIG. 2, the first functional unit 250 can include the first internal functional circuit 251 and the second internal functional circuit 252. According to an embodiment, when the controller 210 needs to control the first functional unit 250 to perform the corresponding operation, the controller 210 can use the first clock enable signal SCN1 to control the clock generator 220 to generate the first clock CLK1. The first operation interface 240 can generate the first power supply signal EN1 according to the first clock CLK1, to enable the first internal functional circuit 251 according to the first power supply signal EN1. At this time, the second internal functional circuit 252 is still disabled.

When the first internal functional circuit 251 starts operating according to the first operation signal SOP1 translated by the first operation interface 240, the first internal functional circuit 251 outputs an internal enable signal ENI, so that the second internal functional circuit 252 can be enabled according to the internal enable signal ENI. When the second internal functional circuit 252 is completely enabled, the second internal functional circuit 252 performs the corresponding operation according to the first operation signal SOP1.

According to an embodiment, when the first internal functional circuit 251 is enabled successfully according to the first power supply signal ENI, to receive the first operation signal SOP1, a logic state of an internal register (not shown in FIG. 2) of the first internal functional circuit 251 is changed, and the first internal functional circuit 251 can generate the internal enable signal ENI according to the logic state of the internal register, so as to enable the second internal functional circuit 252.

According to another embodiment of the present invention, the controller 210 can output the first operation instruction INS1 and the third operation instruction, which is not shown in FIG. 2, to control the first internal functional circuit 251 and the second internal functional circuit 252 to perform corresponding operations, respectively. The first operation interface 240 translates the first operation instruction INS1 and third operation instruction (not shown in FIG. 2), into the first operation signal SOP1 and a third operation signal (not shown in FIG. 2).

When the first internal functional circuit 251 performs the corresponding operation according to the first operation signal SOP1, the first internal functional circuit 251 generates the internal enable signal ENI. According to an embodiment, the first internal functional circuit 251 decodes the first operation signal SOP1 and generates the internal enable signal ENI at the same time. According to another embodiment of the present invention, after decoding the first operation signal SOP1, the first internal functional circuit 251 generates the internal enable signal ENI.

When the second internal functional circuit 252 is completely enabled according to the internal enable signal ENI, the second internal functional circuit 252 performs the corresponding operation according to the third operation signal (not shown in FIG. 2).

According to an embodiment, when the first internal functional circuit 251 and/or the second internal functional circuit 252 are enabled, at least one of the first internal functional circuit 251 and the second internal functional circuit 252 starts receiving power through the internal supply voltage VDDI, it can also indicate that at least one of the first internal functional circuit 251 and the second internal functional circuit 252 starts receiving power through the supply voltage VDD.

According to other embodiments of the present invention, the first functional unit 250 can include a plurality of internal functional circuits. The two internal functional circuits are merely taken as an example for illustration, and the present invention is not limited thereto.

Since the first internal functional circuit 251 and the second internal functional circuit 252 of the first functional unit 250 are enabled in sequence, the problem that the inrush current occurs on the supply voltage VDD because all units or circuits in electronic device are enabled at the same time, can be solved.

Figure 3:
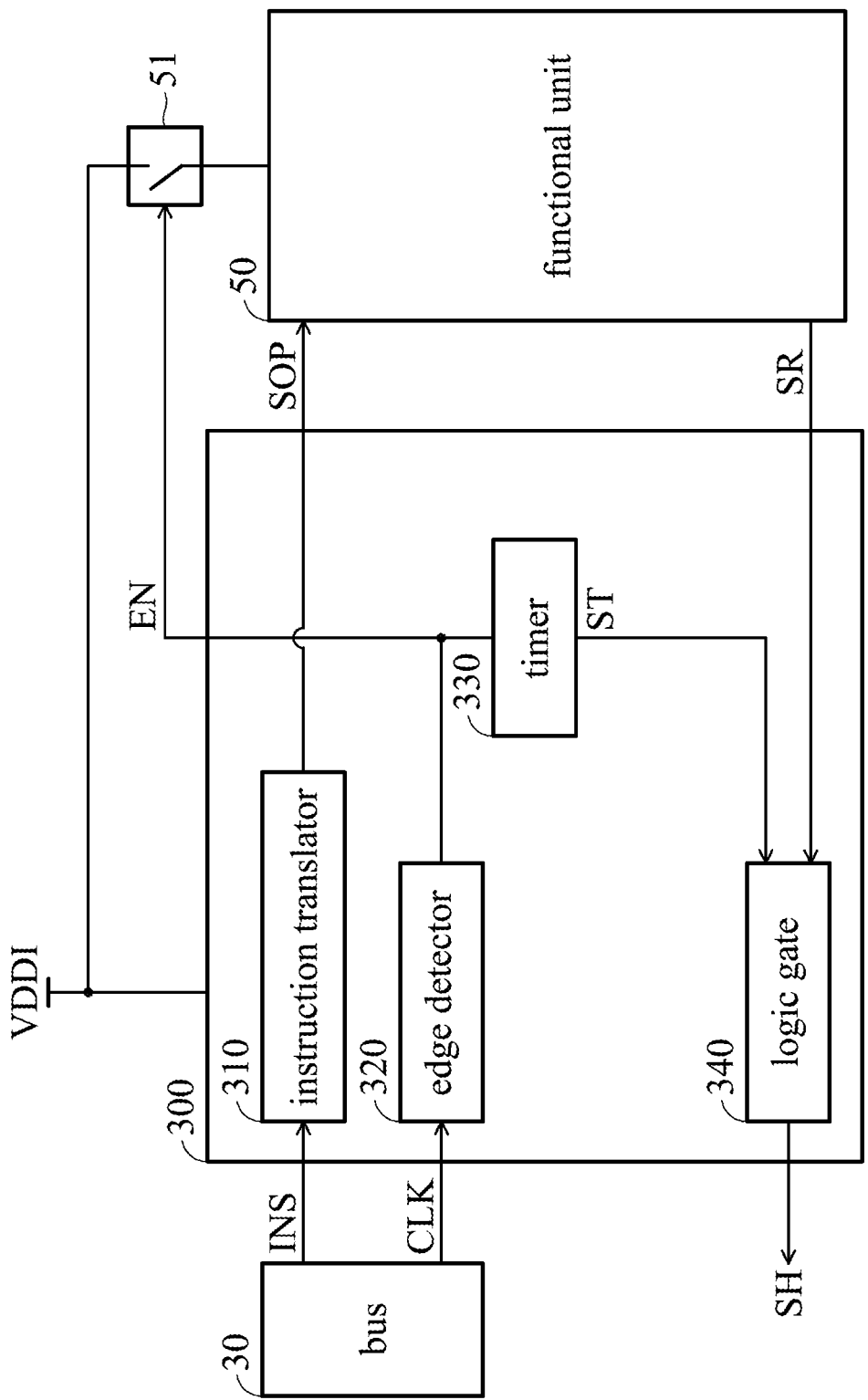
FIG. 3 is a block diagram of an operation interface of an embodiment of the present invention.

Please refer to FIG. 3, which shows a block diagram of an operation interface of an embodiment of the present invention. According to an embodiment, the operation interface 300 shown in FIG. 3 corresponds to the first operation interface 141 and the second operation interface 142 shown in FIG. 1, and the bus 30 shown in FIG. 3 corresponds to the bus 130 shown in FIG. 1, and the functional unit 50 shown in FIG. 3 corresponds to the first functional unit 151 and the second functional unit 152 shown in FIG. 1.

As shown in FIG. 3, the operation interface 300 can include an instruction translator 310, an edge detector 320, a timer 330 and a logic gate 340. The operation interface 300 receives the operation instruction INS and the clock CLK transmitted from the bus 30, and generates a power supply signal EN and the operation signal SOP to control the functional unit 50.

According to an embodiment, the operation instruction INS shown in FIG. 3 corresponds to the first operation instruction INS1 and/or the second operation instruction INS2 shown in FIG. 1. According to an embodiment, the clock CLK shown in FIG. 3 corresponds to the first clock CLK1 and/or the second clock CLK2 shown in FIG. 1.

The instruction translator 310 can translate the operation instruction INS, received from the bus 30, into the operation signal SOP. According to an embodiment, the operation signal SOP shown in FIG. 3 corresponds to the first operation signal SOP1 and/or the second operation signal SOP2 shown in FIG. 1.

The edge detector 320 can detect a signal edge of the clock CLK transmitted through the bus 30, and generate the power supply signal EN to turn on the internal power switch 51 to enable the functional unit 50, so that the functional unit 50 can be supplied with the internal supply voltage VDDI. According to an embodiment, the power supply signal EN shown in FIG. 3 corresponds to the first power supply signal EN1 and/or the second power supply signal EN2 shown in FIG. 1.

According to an embodiment, the edge detector 320 can detect the falling edge of the clock CLK to generate the power supply signal EN; in other word, when the edge detector 320 detects that the clock CLK transitions from a high logic level to a low logic level, the edge detector 320 outputs the power supply signal EN. According to another embodiment of the present invention, the edge detector 320 can detect a rising edge of the clock CLK to generate the power supply signal EN; in other words, when the edge detector 320 detects that clock CLK transitions from the low logic level to the high logic level, the edge detector 320 outputs the power supply signal EN.

According to an embodiment, when the functional unit 50 is completely enabled, the functional unit 50 outputs a ready signal SR. According to an embodiment, the functional unit 50 corresponds to the first functional unit 151 and the second functional unit 152 of FIG. 1. After the first functional unit 151 is completely enabled, the first functional unit 151 outputs a first ready signal (not shown in FIG. 1); when the second functional unit 152 is completely enabled, the second functional unit 152 outputs a second ready signal (not shown in FIG. 1).

The timer 330 can count a predetermined time to generate a counting signal ST. According to an embodiment, the timer 330 can adjust the predetermined time according to an adjustment signal (not shown in FIG. 3). The logic gate 340 can perform a logic calculation on the counting signal ST and the ready signal SR, to generate a hardware signal SH. According to an embodiment, the logic gate 340 can be a NAND.

According to an embodiment, when the first functional unit 151 is completely enabled to output the first ready signal, the first operation interface 141 can generate a first hardware signal according to the counting signal ST and the first ready signal generated by the first functional unit 151. When the second functional unit 152 is completely enabled to output the second ready signal, the second operation interface 142 can generate a second hardware signal according to the counting signal ST and the second ready signal generated by the second functional unit 152.

According to an embodiment, the controller 110 outputs the first operation instruction INS1 and/or the second operation instruction INS2, according to the first hardware signal and/or the second hardware signal output from the first operation interface 141 and/or second operation interface 142 shown in FIG. 1.

Figure 4:
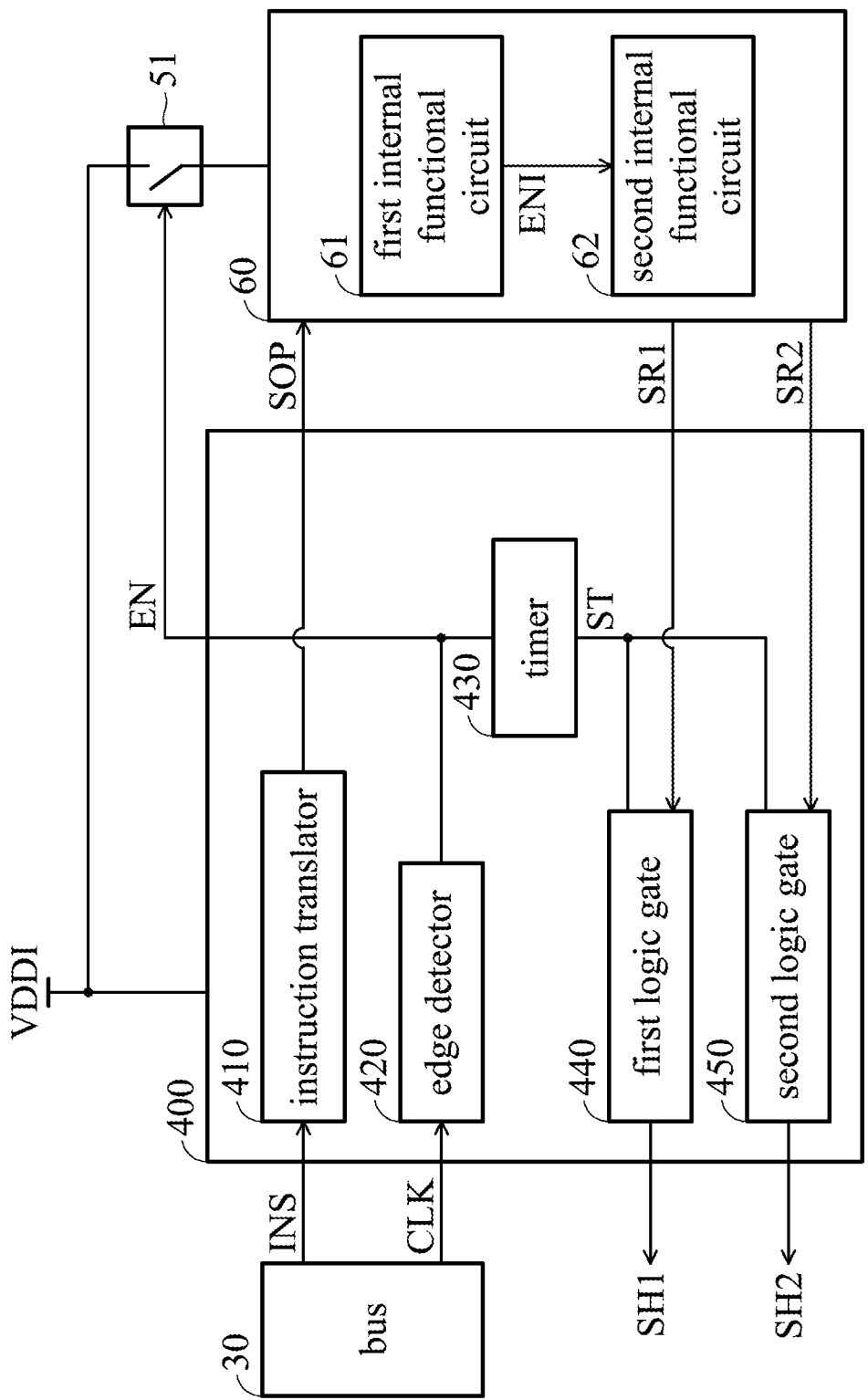
FIG. 4 is a block diagram of an operation interface of another embodiment of the present invention.

FIG. 4 is a block diagram of an operation interface according to another embodiment of the present invention. According to an embodiment, the operation interface 400 shown in FIG. 4 corresponds to the first operation interface 240 shown in FIG. 2, the bus 30 shown in FIG. 4 corresponds to the bus 230 shown in FIG. 2, and the functional unit 60 shown in FIG. 4 corresponds to the first functional unit 250 shown in FIG. 2.

As shown in FIG. 4, the operation interface 400 can include an instruction translator 410, an edge detector 420, a timer 430, a first logic gate 440 and a second logic gate 450. Compared with the operation interface 300 of FIG. 3, the operation interface 400 of FIG. 4 additionally include the first logic gate 440 and the second logic gate 450, and the remaining components are the same as that of the operation interface 300, so detailed descriptions are not repeated herein.

The functional unit 60 can include a first internal functional circuit 61 and a second internal functional circuit 62. The first internal functional circuit 61 and the second internal functional circuit 62 correspond to the first internal functional circuit 251 and the second internal functional circuit 252 of FIG. 2, respectively.

According to an embodiment, when the edge detector 420 detects the signal edge of the clock signal CLK transmitted via the bus 30, the edge detector 420 generates the power supply signal EN to turn on the internal power switch 51 to enable the first internal functional circuit 61, so that the first internal functional circuit 61 can be supplied with the internal supply voltage VDDI. According to an embodiment, the power supply signal EN of FIG. 4 corresponds to the first power supply signal EN1 of FIG. 2.

When the first internal functional circuit 61 is completely enabled, the first internal functional circuit 61 outputs the first ready signal SR1. The first logic gate 440 then generates a first hardware ready signal SH1 according to the counting signal ST and the first ready signal SR1 generated by the timer 430.

When the first internal functional circuit 61 starts operating according to the operation instruction INS transmitted via bus 30, the first internal functional circuit 61 generates the internal enable signal ENI to enable the second internal functional circuit 62. According to an embodiment, the operation instruction INS of FIG. 4 corresponds to the first operation instruction INS1 of FIG. 2.

When the second internal functional circuit 62 is completely enabled, the second internal functional circuit 62 outputs the second ready signal SR2. The second logic gate 450 then generates a second hardware ready signal SH2 according to the counting signal ST and the second ready signal SR2 generated by the timer 430. According to an embodiment, the first logic gate 440 and the second logic gate 450 can be AND gates.

According to an embodiment, the controller 210 of FIG. 2 can use the first operation instruction INS1 to control the operations of the first internal functional circuit 251 and the second internal functional circuit 252 according to the first hardware ready signal SH1 and the second hardware ready signal SH2. According to another embodiment of the present invention, the controller 210 can output the first operation instruction INS1 before the first hardware ready signal SH1 and the second hardware ready signal SH2. When the first hardware ready signal SH1 is output, the first internal functional circuit 251 performs the corresponding operation according to the first operation instruction INS1; when the second hardware ready signal SH2 is output, the second internal functional circuit 251 performs the corresponding operation according to the first operation instruction INS1.

According to another embodiment of the present invention, the controller 210 can output the first operation instruction INS1 and the third operation instruction (not shown in FIG. 2), to control the first internal functional circuit 251 and the second internal functional circuit 252 for performing the corresponding operations, respectively. When the first hardware ready signal SH1 is output, the first internal functional circuit 251 performs the corresponding operation again according to the first operation instruction INS1; when the second hardware ready signal SH2 is output, the second internal functional circuit 251 performs the corresponding operation according to the third operation instruction (not shown in FIG. 2).

According to another embodiment of the present invention, the operation interface 400 of FIG. 4 can perform logic calculation on the first hardware ready signal SH1 and the second hardware ready signal SH2, to generate an integrated hardware ready signal (not shown in FIG. 2). When the controller 210 receives the integrated hardware ready signal, it indicates that the first internal functional circuit 251 and the second internal functional circuit 252 are completely enabled.

Figure 5:
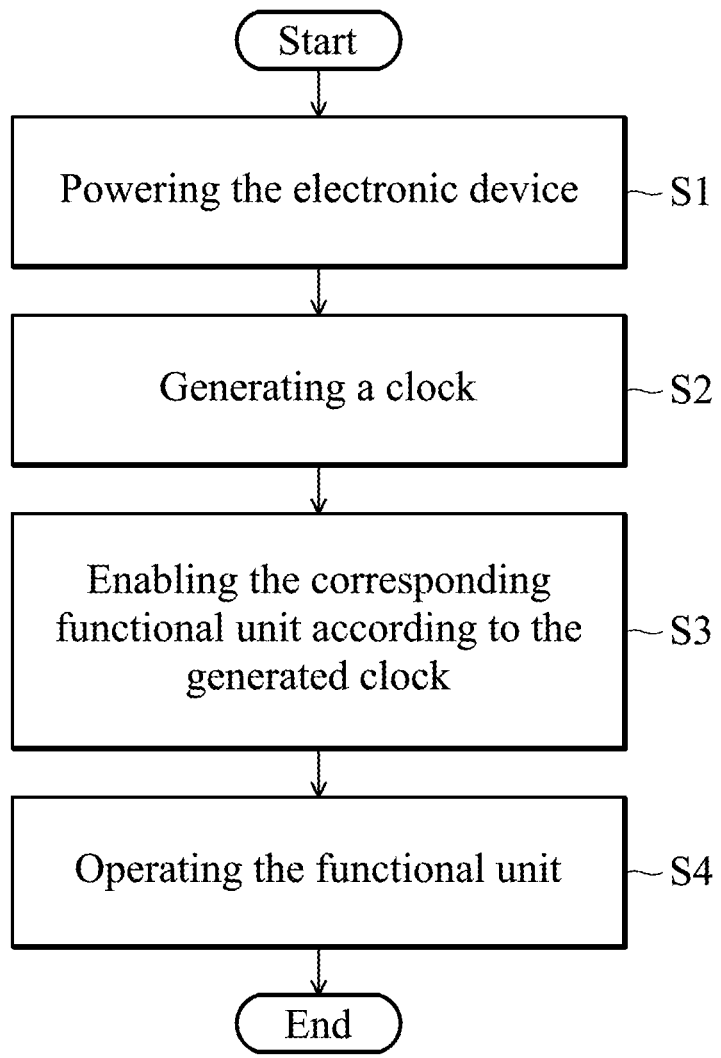
FIG. 5 is a flowchart of a powering method according to an embodiment of the present invention.

Please refer to FIG. 5, which shows a flowchart of a powering method according to an embodiment of the present invention. The details of the flowchart of FIG. 5 will be explained below with reference to FIGS. 1 and 2. The powering method includes steps S1 to S4.

First, in a step S1, the electronic device 100 of FIG. 1 or the electronic device 200 of FIG. 2 is supplied with power. As shown by FIG. 1 and FIG. 2, the electronic device 100 and/or the electronic device 200 can be supplied with the supply voltage VDD according to the power-on signal.

In a step S2, when it is necessary to enable the functional unit to start operating, a clock corresponding to the functional unit is generated. According to an embodiment, as shown in FIG. 1, when the controller 110 needs to operate the first functional unit 151, the controller 110 generates the first clock CLK1; when the controller needs to operate the second functional unit 152, the controller 110 generates the second clock CLK2. According to another embodiment of the present invention, as shown in FIG. 2, when the controller 210 needs to operate the first functional unit 250, the controller 110 generates the first clock CLK1.

Next, in a step S3, the corresponding functional unit is enabled according to the generated clock. According to an embodiment, as shown in FIG. 1, the first operation interface 141 enables the first functional unit 151 according to the first clock CLK1, and the second operation interface 142 enables the second functional unit 152 according to the second clock CLK2. According to another embodiment of the present invention, as shown in FIG. 2, the first operation interface 240 enables the first internal functional circuit 251 of the first functional unit 250 according to the first clock CLK1.

In a step S4, the operation instruction is output to operate the functional unit. According to an embodiment, as shown in FIG. 1, the controller 110 outputs the first operation instruction INS1 and/or the second operation instruction INS2 to control the first functional unit 151 and/or the second functional unit 152 to perform the corresponding operation. According to another embodiment of the present invention, as shown in FIG. 2, the controller 210 outputs the first operation instruction INS1 to control the first internal functional circuit 251 and the second internal functional circuit 252 to perform the corresponding operation. According to another embodiment of the present invention, the controller 210 outputs the first operation instruction INS1 and the third operation instruction (not shown in FIG. 2), to control the first internal functional circuit 251 and the second internal functional circuit 252 to perform the corresponding operation.

According to above-mentioned embodiment, the present invention provides an electronic device with the smart power-on function, and a powering method thereof, so that the unused functional unit of the electronic device can be powered on just before starting to operate, so as to reduce power loss and prevent surge current on the supply voltage. The functional unit can be divided into multiple internal functional circuits as shown in FIG. 2, multiple internal functional circuits are powered on in sequence in which the internal functional circuits are operated, so as to reduce unnecessary power loss and prevent inrush current occurred on the power supply.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. An electronic device, comprising:
   a controller configured to generate a first operation instruction and a first clock enable signal;
   a clock generator configured to generate a first clock according to the first clock enable signal;
   a first operation interface configured to translate the first operation instruction into a first operation signal and triggered by a signal edge of the first clock to generate a first power supply signal, wherein the first operation interface comprises an edge detector configured to detect the signal edge of the first clock to generate the first power supply signal; and
   a first functional unit being enabled according to the first power supply signal, and configured to operate according to the first operation signal,
   wherein after being completely enabled, the first functional unit outputs a first ready signal, and
   wherein the controller generates a second operation instruction and a second clock enable signal, the clock generator generates a second clock according to the second clock enable signal, and the electronic device further comprises:
   a second operation interface coupled to a bus, triggered by a signal edge of the second clock to generate a second power supply signal, and configured to translate the second operation instruction into a second operation signal; and
   a second functional unit being enabled according to the second power supply signal and configured to operate according to the second operation signal.

2. The electronic device according to claim 1, wherein the first functional unit comprises:
   a first internal functional circuit being enabled according to the first power supply signal, wherein when the first internal functional circuit operates according to the first operation signal, the first internal functional circuit generates an internal enable signal; and
   a second internal functional circuit being enabled according to the internal enable signal.

3. The electronic device according to claim 1, wherein the controller, the clock generator, the first operation interface and the second operation interface are supplied with a supply voltage at the same time when the electronic device is enabled according to a power-on signal, wherein after the first functional unit is enabled according to the first power supply signal, the first functional unit is supplied with the supply voltage, wherein after the second functional unit is enabled according to the second power supply signal, the second functional unit is supplied with the supply voltage.

4. The electronic device according to claim 1, further comprising:
   the bus coupled to the controller, the clock generator, the first operation interface and the second operation interface, and configured to transmit the first operation instruction and the first clock to the first operation interface, and to transmit the second operation instruction and the second clock to the second operation interface.

5. A powering method, applicable to an electronic device comprising a first functional unit, and the powering method comprises:
   generating a first clock according to a first clock enable signal;
   enabling the first functional unit in response to a signal edge of the first clock, wherein said enabling the first functional unit in response to the signal edge of the first clock comprises:
   detecting the signal edge of the first clock;
   by using a first operation interface, generating a first power supply signal triggered by the signal edge of the first clock and translating a first operation instruction into a first operation signal, said generating the first power supply signal triggered by the signal edge of the first clock and translating a first operation instruction into a first operation signal comprising detecting the signal edge of the first clock to generate the first power supply signal by using an edge detector, wherein after being completely enabled, the first functional unit outputs a first ready signal; and
   enabling the first functional unit according to the first power supply signal; and
   operating the first functional unit according to the first operation signal.

6. The powering method according to claim 5, wherein the first functional unit comprises a first internal functional circuit and a second internal functional circuit, and the step of enabling the first functional unit in response to a signal edge of the first clock comprises:
   enabling the first internal functional circuit in response to the signal edge of the first clock; and
   enabling the second internal functional circuit after the first internal functional circuit is operated.

7. The powering method according to claim 5, wherein the electronic device comprises a second functional unit, and the powering method further comprises:
   generating a second clock;
   enabling a second functional unit in response to the signal edge of the second clock; and
   operating the second functional unit.

8. The powering method according to claim 7, wherein the electronic device is supplied with a supply voltage, and the first functional unit is supplied with the supply voltage after the first functional unit is enabled according to a first power supply signal, wherein the second functional unit is supplied with the supply voltage after the second functional unit is enabled according to a second power supply signal.

9. The powering method according to claim 5, wherein said enabling the first functional unit in response to the signal edge of the first clock further comprises:
   counting a predetermined time; and
   outputting the first operation instruction when the first functional unit is enabled completely and the predetermined time is counted completely.

* * * * *